US007615204B2

(12) United States Patent
Ajayan et al.

(10) Patent No.: US 7,615,204 B2
(45) Date of Patent: Nov. 10, 2009

(54) DIRECT SYNTHESIS OF LONG SINGLE-WALLED CARBON NANOTUBE STRANDS

(75) Inventors: Pulickel M. Ajayan, Troy, NY (US); Bingqing Wei, Troy, NY (US); Hongwei Zhu, Beijing (CN); Cailu Xu, Beijing (CN); Dehai Wu, Beijing (CN)

(73) Assignees: Rensselaer Polytechnic Institute, Troy, NY (US); Tsinghua University, Beijing (CN)

( * ) Notice: Subject to any disclaimer, the term of this patent is extended or adjusted under 35 U.S.C. 154(b) by 1214 days.

(21) Appl. No.: 10/370,519

(22) Filed: Feb. 24, 2003

(65) Prior Publication Data

US 2003/0161950 A1 Aug. 28, 2003

Related U.S. Application Data

(60) Provisional application No. 60/368,230, filed on Mar. 28, 2002.

(30) Foreign Application Priority Data

Feb. 22, 2002 (CN) ............................... 02 1 00684

(51) Int. Cl.
*D01F 9/12* (2006.01)
*B82B 1/00* (2006.01)
(52) U.S. Cl. .................... 423/447.2; 428/367; 977/742; 977/750
(58) Field of Classification Search ............... 423/447.1, 423/447.2, 447.3; 428/367; 977/DIG. 1, 977/742, 750
See application file for complete search history.

(56) References Cited

U.S. PATENT DOCUMENTS

| 5,458,784 | A | 10/1995 | Baker et al. | |
| 6,333,016 | B1 | 12/2001 | Resasco et al. | |
| 6,749,827 | B2 * | 6/2004 | Smalley et al. | 423/447.3 |

OTHER PUBLICATIONS

Jiang et al. "Spinning continuous carbon nanotube yarns" Oct. 24, 2002, Nature, vol. 419, p. 801.*
H. W. Zhu, et al., "Direct Synthesis of Long Single-Walled Carbon Nanotube Strands," Science, vol. 296, pp. 884-886 (May 3, 2002).
Bingqing Wei, et al., "Structural Characterizations of Long Single-Walled Carbon Nanotube Strands," Nano Letters, vol. 2, No. 10, pp. 1105-1107 (2002).
Yan-Hui Li, et al., "Self-organized Ribbons of Aligned Carbon Nanotubes," Chem. Mater., 14, pp. 483-485 (2002).

Lijie Ci, et al., "Preparation of carbon nanofibers by the floating catalyst method," Carbon 38, pp. 1933-1937 (2000).
Cheng et al, Chemical Physics Letters, Jun. 19, 1998, vol. 289, pp. 602-610.
Cheng et al, Applied Physics Letters, Jun. 22, 1998, vol. 72, No. 25, pp. 3282-3284.
B. Vigolo, et al., Science 290, 1331 (2000).
M. Endo et al., J. Phys. Chem. Solid 54, 1841 (1993).
R. Andrews et al, Chem Phys. Lett. 303, 467 (1999).
J.E. Fischer et al, Phys. Rev. B 55, R4921 (1997).
P.H. Zhang, P.E. Lammert, V.H. Crespi, Phys. Rev. Lett. 81, 5346 (1998).
M. M. J. Treacy, T.W. Ebbesen, J.M. Gibson, Nature 381, 678 (1996).
E.W. Wong, P.E. Sheehan, C.M. Lieber, Science 277, 1971 (1997).
M.F. Yu, B.S. Files, S. Areepalli, R.S. Ruoff, Phys. Rev. Lett. 84, 5552 (2000).
J.P. Lu, Phys. Rev. Lett. 79, 1297 (1997).
Baughman et al., "Carbon Nanotube Actuators," Science, May 21, 1999, vol. 284, pp. 1340-1344.
Fan et al., "Self-Oriented Regular Arrays of Carbon Nanotubes and Their Field Emission Properties," Science, Jan. 22, 1999, vol. 283, pp. 512-514.
Forro et al., "Physical Properties of Multi-wall Nanotubes," Carbon Nanotubes, Topics Appl. Phys., 2001, vol. 80, pp. 329-390.
Hata et al., "Water-Assisted Highly Efficient Synthesis of Impurity-Free Single-Walled Carbon Nanotubes," Science, Nov. 19, 2004, vol. 306, pp. 1362-1364.
Iijima, Sumio, "Helical microtubules of graphitic carbon," Nature, Nov. 7, 1991, vol. 354, pp. 56-58.
Kim et al., "Synthesis of Ultralong and High Percentage of Semiconducting Single-walled Carbon Nanotubes," Nano Letters, 2002, vol. 2, No. 7, pp. 703-708.
Launois et al., "Structural Characterization of Nanotube Fibers by X-ray Scattering," J. Nanosci. Nanotech., 2001, vol. 1, No. 2, pp. 125-128.
Li et al., "Tensile strength of single-walled carbon nanotubes directly measured from their macroscopic ropes," Applied Physics Letters, Nov. 13, 2000, vol. 77, No. 20, pp. 3161-3163.
Pan et al., "Very long carbon nanotubes," Nature, Aug. 13, 1998, vol. 394, pp. 631-632.
Rols et al., "Diffraction by finite-size crystalline bundles of single wall nanotubes," Eur. Phys. J. B, 1999, vol. 10, pp. 263-270.
Thess et al., "Crystalline Ropes of Metallic Carbon Nanotubes," Science, Jul. 26, 1996, vol. 273, pp. 483-487.
Zhu et al., "Direct Synthesis of Long Single-Walled Carbon Nanotube Strands," Science, May 3, 2002, vol. 296, pp. 884-886.

* cited by examiner

*Primary Examiner*—Stuart Hendrickson
(74) *Attorney, Agent, or Firm*—Foley & Lardner LLP

(57) ABSTRACT

Long, macroscopic nanotube strands or cables, up to several tens of centimeters in length, of aligned single-walled nanotubes are synthesized by the catalytic pyrolysis of n-hexane using an enhanced vertical floating catalyst CVD technique. The long strands of nanotubes assemble continuously from ropes or arrays of nanotubes, which are intrinsically long. These directly synthesized long nanotube strands or cables can be easily manipulated using macroscopic tools.

21 Claims, 6 Drawing Sheets

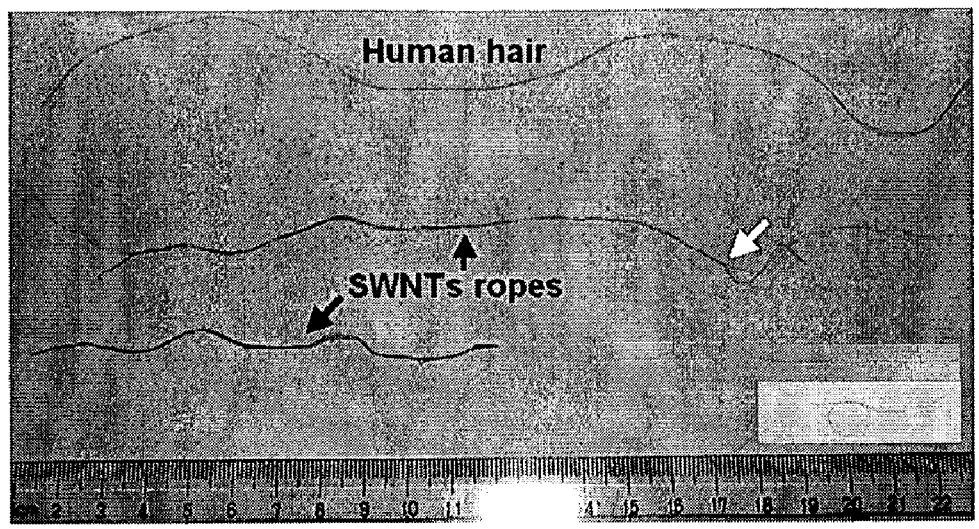
FIGURE 4
FIGURE 5A          FIGURE 5B          FIGURE 5C
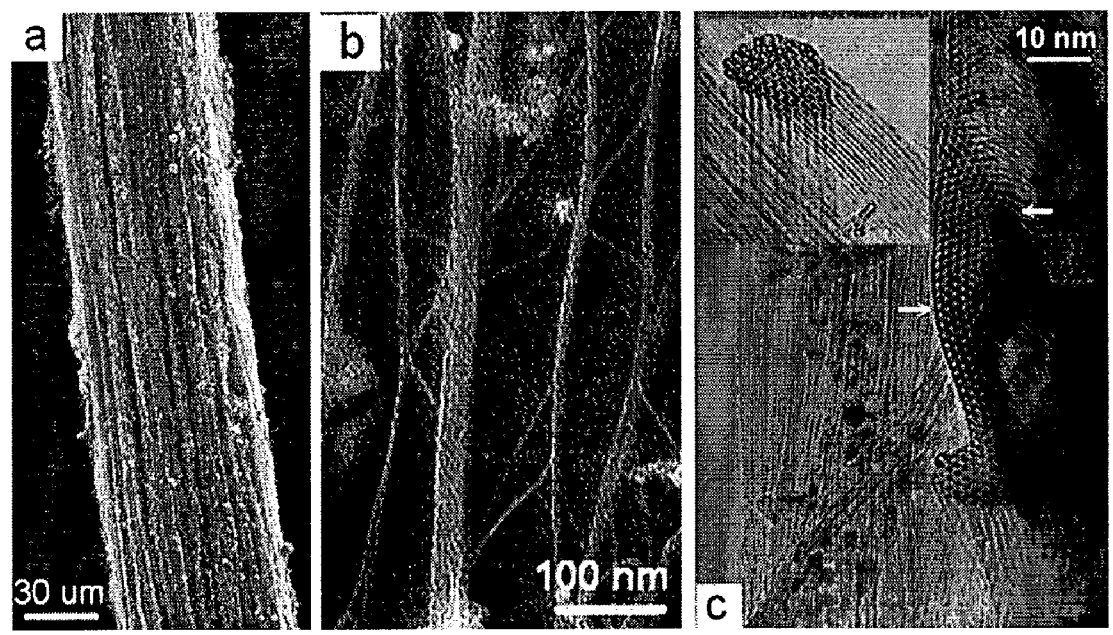

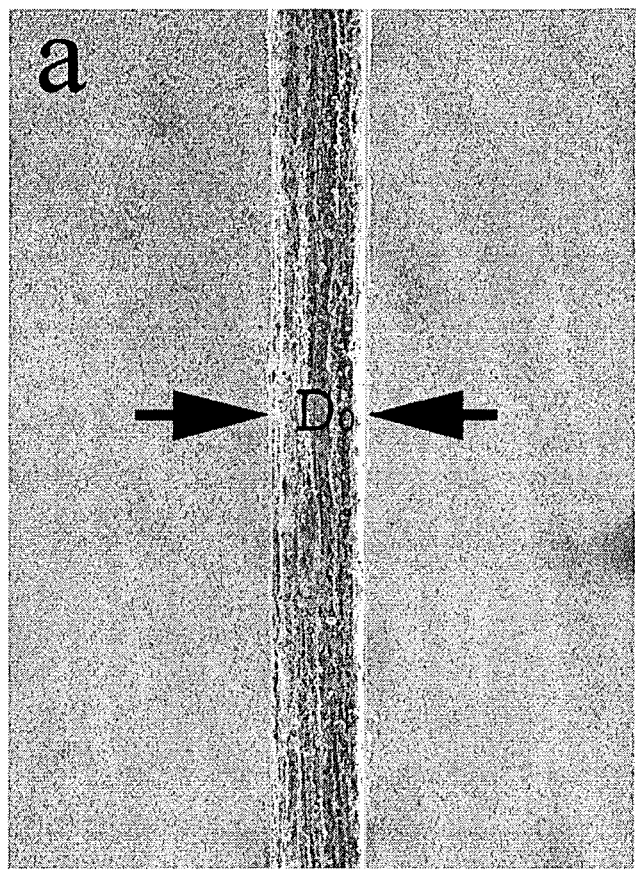
FIGURE 6A
FIGURE 6B
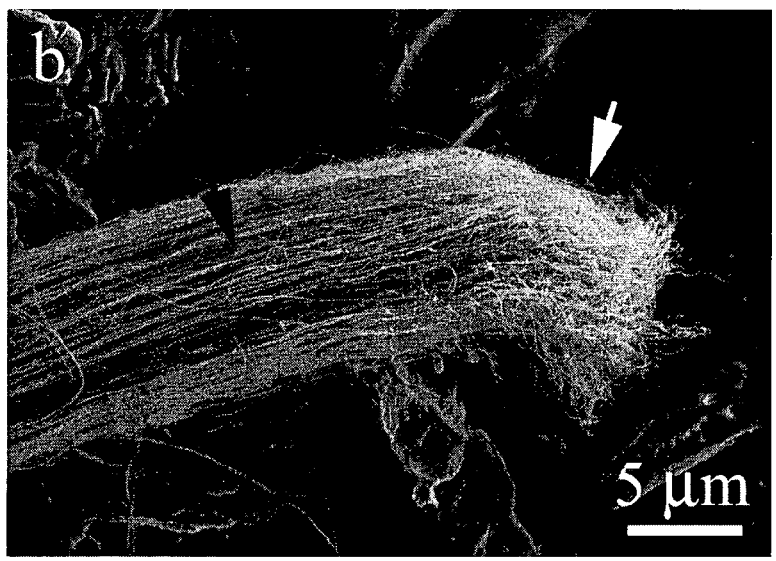

DIRECT SYNTHESIS OF LONG SINGLE-WALLED CARBON NANOTUBE STRANDS

CROSS-REFERENCE TO RELATED PATENT APPLICATIONS

The present application claims benefit under 35 U.S.C. § 119(e) of U.S. provisional application 60/368,230, filed Mar. 28, 2002 and foreign priority benefits under Title 35, United States Code §119(a)-(d) of People's Republic of China Application Serial No. 02100684.9 filed Feb. 22, 2002, which are incorporated herein by reference in their entirety.

STATEMENT REGARDING FEDERALLY SPONSORED RESEARCH OR DEVELOPMENT

The U.S. Government may have certain rights in this invention pursuant to grant numbers DMR-9733028 and DMR-0117792 from the National Science Foundation.

BACKGROUND OF THE INVENTION

The present invention is directed to carbon nanotubes in general and to direct synthesis of long strands or bundles of nanotubes by chemical vapor deposition.

There has been much interest in the production and processing of carbon nanotubes since their discovery. Aligned multi-walled carbon nanotubes with 2 mm length (see Z. Pan et al., Nature 394, 631 (1998)) and long single-walled nanotube (SWNT) ropes of up to three centimeters (see H. M. Cheng et al., Chem. Phys. Lett. 289, 602 (1998)) have been reported. Furthermore, macroscopic SWNT fibers and ribbons made by post-processing techniques (see B. Vigolo et al., Science 290, 1331 (2000)) have also been reported. However, the post processing techniques involve dispersing the nanotubes in surfactant solutions and then recondensing the nanotubes in a stream of polymer solution. This complicates the processing and affects the properties of the nanotubes. Thus, the creation of directly synthesized, continuous macroscopic strands of nanotubes during production still remains a challenge.

Chemical Vapor Deposition (CVD) is often used to produce single walled carbon nanotubes (SWNTs). CO gas was first used as a carbon source to synthesize single walled carbon nanotubes (see Dai et al., Chemical Physics Letters, 260, 471 (1996)). However, the SWNT yield was very low, and an extremely strict control of the CVD parameters was required. Subsequently, ethylene, methane, benzene were also used as carbon sources to produce single walled carbon nanotubes.

A floating catalyst CVD method with a horizontal furnace was used to synthesize single walled carbon nanotubes (see Cheng et al., Applied Physics Letters, 72, 3282 (1998)). The single walled carbon nanotubes were microscale in length, with a poor alignment and purity.

The floating catalyst method with a vertical furnace is an efficient method for mass-production of multiwalled carbon nanotubes and carbon nanofibers (see Ci, et al., Carbon, 38, 1933 (2000)). Benzene or xylene is usually used as a carbon source, ferrocene $(Fe(C_5H_5)_2)$ as a catalyst, and thiophene $(C_4H_4S)$ as an additive. Typically ferrocene assisted CVD of hydrocarbons (benzene or xylene) produces multi-walled carbon nanotubes at lower temperatures (about 1050 K) and mixture of single-walled and multi-walled nanotubes at higher temperatures (>1300 K) (see M. Endo et al., J. Phys. Chem. Solid 54, 1841 (1993); R. Andrews et al., Chem. Phys. Lett. 303, 467 (1999); H. M. Cheng et al., Appl. Phys. Lett. 72, 3282 (1998)). However, benzene is toxic and might pollute the environment. The addition of thiophene has been shown to increase the yield of single-walled nanotubes (see H. M. Cheng et al., Appl. Phys. Lett. 72, 3282 (1998)).

SUMMARY OF THE INVENTION

A preferred embodiment of the present invention provides a continuous carbon nanotube strand having a length of at least 10 cm when it is directly synthesized.

Another preferred embodiment of the present invention provides a directly synthesized, continuous single wall carbon nanotube having an aspect ratio of at least $10^8$.

Another preferred embodiment of the present invention provides a macroscopic carbon nanotube strand made by synthesizing the strand using a chemical vapor deposition with an n-hexane source.

Another preferred embodiment of the present invention provides a carbon nanotube strand having a Young's modulus of at least 49 GPa.

Another preferred embodiment of the present invention provides a method of synthesizing carbon nanotubes using a chemical vapor deposition process, comprising providing a gas comprising n-hexane, and synthesizing the carbon nanotubes from the gas comprising n-hexane.

BRIEF DESCRIPTION OF THE DRAWINGS

FIG. 4 is a photograph of carbon nanotube strands according to a preferred embodiment of the present invention.

FIGS. 5A-B are SEM images of carbon nanotube structures according to a preferred embodiment of the present invention.

FIG. 5C is an HRTEM image of a SWNT rope according to a preferred embodiment of the present invention.

FIGS. 6A-B are SEM images of SWNT strands before and after tensile testing, respectively, according to a preferred embodiment of the present invention.

DETAILED DESCRIPTION OF THE PREFERRED EMBODIMENTS

Figure 1:
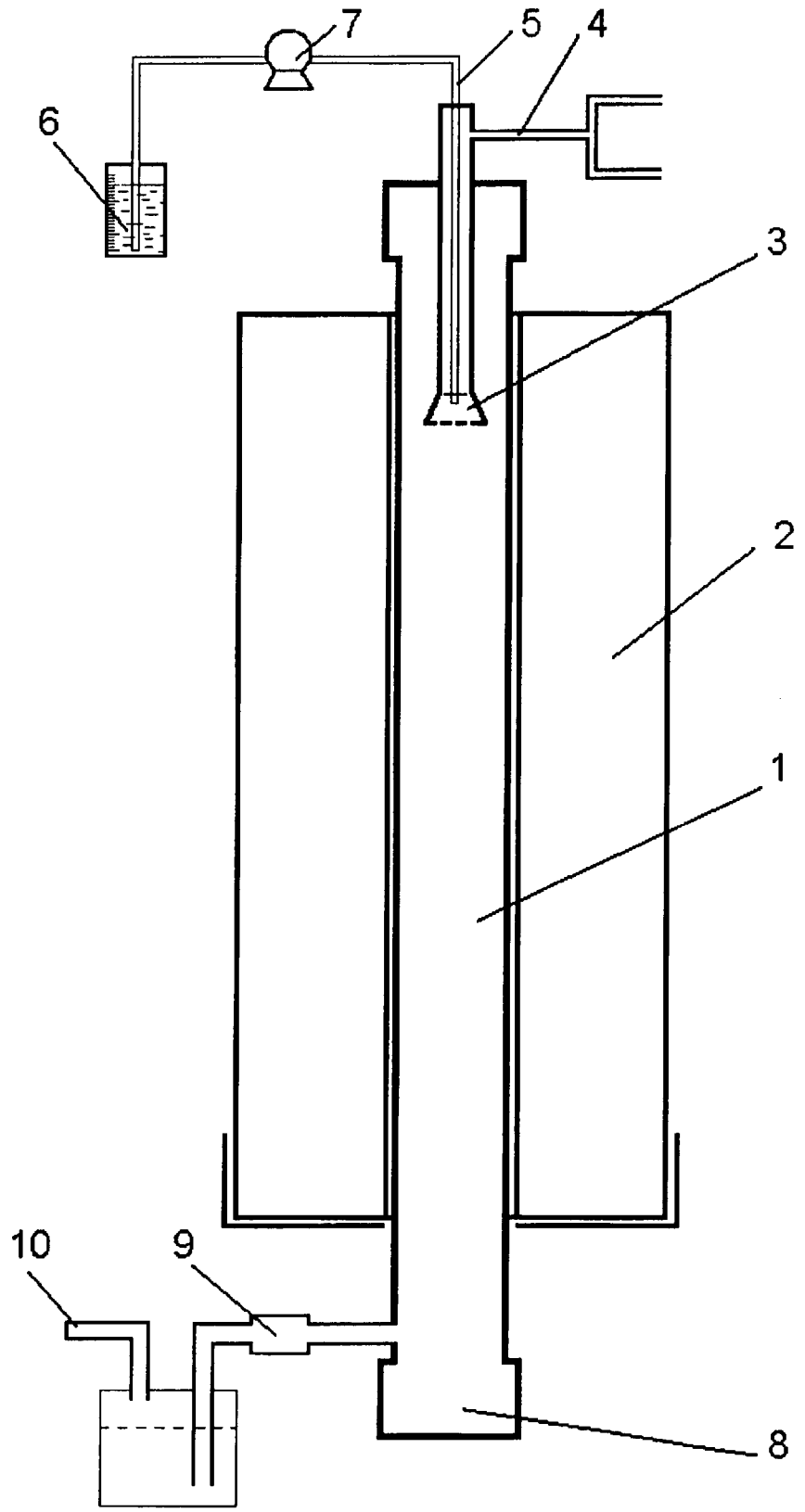
FIG. 1 is a schematic of a CVD apparatus according to a preferred embodiment of the present invention.

The present inventors have discovered that long strands of ordered, single-walled carbon nanotubes may be directly synthesized by an optimized catalytic chemical vapor deposition technique using a floating catalyst method in a vertical furnace where n-hexane is catalytically pyrolyzed. The term "strand," as used herein, means a fiber, cable or filament having a high length to diameter aspect ratio. The term "directly synthesized strand" means a strand having a given length after strand fabrication prior to any post processing attempts to extend the length of the strand. For example, in the preferred embodiments of the present invention, the term "directly synthesized strand" is a strand that has macroscopic length after it is collected from the chemical vapor deposition (CVD) apparatus.

In a preferred embodiment of the present invention, the continuous, directly synthesized carbon nanotube strand is macroscopic or "super long". In other words, the directly synthesized strand has a length that is visible to the naked eye without resort to magnifying instruments. The term "super long" in this case refers to the length of single walled carbon nanotubes up to tens of centimeters. The term "continuous" refers to the continuous growth of single walled carbon nanotubes without interruption. Preferably, the strand length is greater than several centimeters, such as greater than 5 cm, more preferably greater than 10 cm. Most preferably, the strand length is 10-30, such as 10 to 20 cm. In another preferred embodiment of the present invention, the single walled carbon nanotubes in the strands have an aspect ratio of greater than $10^8$.

In a preferred embodiment of the present invention, the directly synthesized, macroscopic nanotube strands comprising single walled carbon nanotubes are made by a CVD method using n-hexane as a precursor. Most preferably, the nanotube strands are made using a CVD floating catalyst method with a vertical reaction chamber. In the floating catalyst method, an n-hexane/ferrocene/thiophene mixture is vaporized and carried into the vertical reaction chamber with a flowing carrier gas, such as hydrogen gas. n-hexane ($C_6H_{14}$) in the mixture solution acts as a carbon source, ferrocene ($Fe(C_5H_5)_2$) acts as a catalyst and thiophene (($C_4H_4S$), a sulfur additive) acts as a promoter for single walled nanotube production.

The method provides macroscopic or super long single walled carbon nanotube strands with good alignment and high purity (up to 85-95% pure). The single walled nanotubes in the strands are continuous, smooth and straight, and up to several tens of centimeters in length, such as 10-30 cm in length, preferably 10-20 cm, and have an aspect ratio of more than $10^8$ for an individual nanotube. The method is simple, scalable and cost effective to mass produce macroscopic or super long continuous single walled carbon nanotubes.

However, the present invention is not limited to the floating catalyst method described above and other methods may be used instead. For example, the furnace or reaction chamber may be oriented in a non-vertical direction. Other catalysts, promoters and carrier gases may be used instead. For example, an argon/hydrogen mixture may be used as a carrier gas instead of hydrogen.

FIG. 1 illustrates a CVD apparatus used for the floating catalyst method according to a preferred embodiment of the present invention. The apparatus contains a reaction chamber 1. Preferably, the reaction chamber 1 is a ceramic tube (outer diameter: 68 mm, inner diameter: 58 mm, and length 1600 mm), which is mounted vertically inside the electronic furnace 2, having a rated temperature of 1200° C. and a rated power 6 kW, for example. Other temperature and power ratings may also be used.

An evaporator 3 is located in an upper part of the reaction chamber 1. The evaporator contains a first inlet 4 for gases, such as the carrier gas, and a second inlet 5 for the nanotube source solution, such as a mixture solution of n-hexane, ferrocene and thiophene. The mixture solution is pumped from a storage vessel 6 via a liquid microflow rate pump 7 into the evaporator 3. The evaporator is adapted to vaporize the solution into the carrier gas at a temperature of about 150 to about 200° C. The carrier gas carries the evaporated solution into the reaction chamber 1 in the form of a gas phase. The CVD apparatus also contains a collector 8 at the bottom of the reaction chamber where the carbon nanotubes are collected, a filter 9, and a gas outlet 10 connected to the bottom portion of the reaction chamber 1. However, the present invention should not be considered limited to the apparatus shown in FIG. 1 and other suitable CVD apparatus may be used instead.

A floating catalyst method of the preferred embodiment of the present invention will now be described. Thiophene and ferrocene are dissolved in liquid n-hexane in the storage vessel 6 and the mixture solution of liquid n-hexane containing the thiophene and ferrocene is then provided (i.e., sprayed) into the hydrogen carrier gas stream in the evaporator 3. The liquid n-hexane containing the thiophene and ferrocene is evaporated (i.e., vaporized) and fed from the top into the heated vertical reaction chamber 1. The hydrogen flow rate is adjusted to provide the optimum conditions for nanotube strand formation. The n-hexane is catalytically pyrolized in the reaction chamber 1 to form the carbon nanotube strands, and the gas flow carries the strands downstream through the reaction chamber. The nanotube strands are collected in the collector 8 at the bottom of the reaction chamber 1. The nanotube strands are then removed from the collector. Preferably, ferrocene is directly dissolved in the n-hexane and flowed into the evaporator along with the carbon source solution, without the pre-reduction under hydrogen atmosphere so as to simplify processing. However, if desired, ferrocene may be pre-reduced under a hydrogen atmosphere.

The following process ranges and parameters are provided for illustration of the preferred embodiments of the present invention and should not be considered limiting on the scope of the invention. First, a pre-processing gas, such as argon gas, is passed through the reaction chamber 1, at the rate of 100 ml/min, while the furnace 2 temperature increases to the reaction temperature. The flowing argon gas is switched to flowing hydrogen gas when the temperature reaches about 1000° C.

After reaching the preset reaction temperature of about 1100° C. to about 1200° C., the n-hexane, ferrocene and thiophene mixture solution was introduced into the reaction chamber 1 together with the hydrogen gas through evaporator 3 so as to begin the reaction. Preferred ferrocene range in the mixture solution is about 0.01 to about 0.02 g/ml. Preferred thiophene ranges in the mixture solution is about 0.2 about 0.6 weight percent. The term "about" allows a deviation of about 5%, preferably about 10% from the stated value. The preferred flow rate of the mixture solution is about 0.2 to about 0.8 ml/min, while the preferred flow rate of the hydrogen gas is about 150 to about 300 ml/min. The reaction is conducted for a preset period of time, such as 30 to 90 minutes, preferably about 60 minutes, to generate the nanotube strands and then terminated by flowing argon gas at about 100 ml/min instead of flowing hydrogen. The nanotube strands are then collected after cooling the reaction chamber and furnace to room temperature. Other suitable temperature, concentration and flow ranges may also be used.

Figure 2:
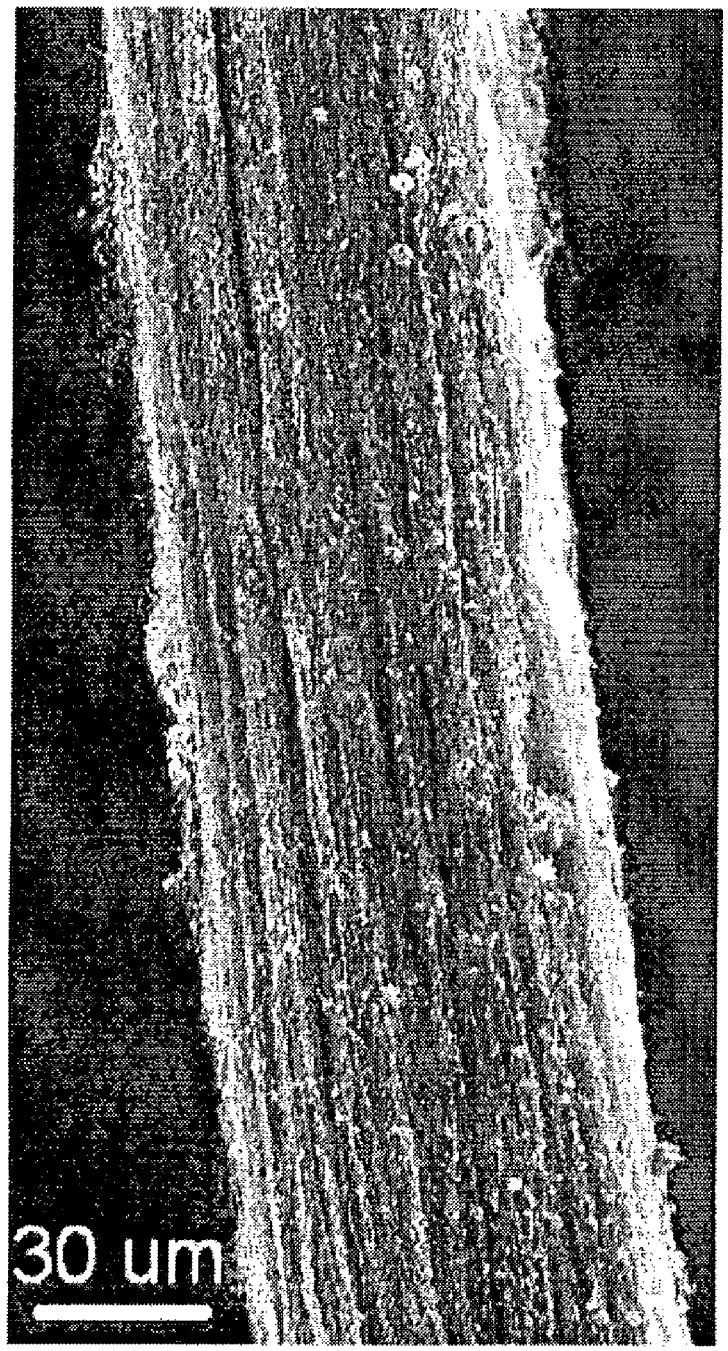
FIG. 2 is a scanning electronic microscopy image of the morphology of the synthesized single walled carbon nanotube strands according to a preferred embodiment of the present invention.
Figure 3:
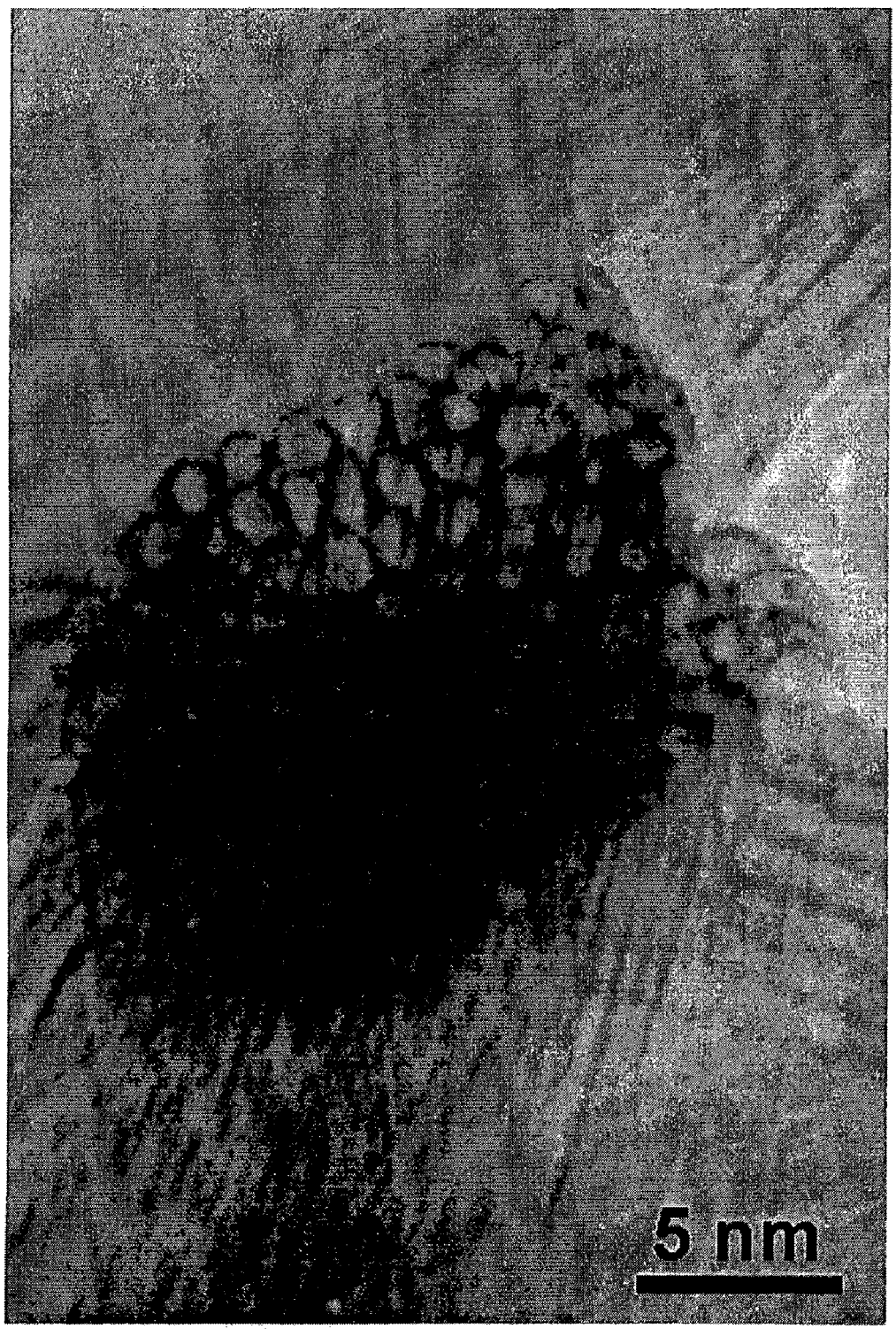
FIG. 3 is a transmission electronic microscopy image of the microstructure of the synthesized single walled carbon nanotube strands according to a preferred embodiment of the present invention.

The morphology and microstructures of the products were examined using SEM (shown in FIG. 2) and TEM (shown in FIG. 3). The diameter distribution and the degree of crystallization of produced nanotubes were examined using micro Raman. The results indicate that the floating catalyst method in a vertical furnace can be used to realize mass production of the macroscopic or super long continuous single walled carbon nanotubes. The products consist of a large amount of densely packed aligned single walled carbon nanotube strands, in which the single walled nanotubes can be up to 20 to 30 cm in length. The diameter of nanotubes is in the range of 1-2 nm and the highest purity of single walled carbon nanotubes can be up to 85 to 95%.

The present inventors noted that without hydrogen flow, the yield of nanotube growth rapidly decreases and no long strands were produced. Replacing n-hexane with other hydrocarbons results in lower yields of single-walled nanotubes and once again no macroscopic self-assembled strands were created. The macroscopic strands produced using n-hexane and hydrogen carrier gas contain about 5 wt % impurities, which can be analyzed by thermo-gravimetric analysis (TGA) to be catalyst (Fe) particles and amorphous carbon. Majority of the catalyst particles can be removed by high temperature vacuum annealing or refluxing the strands in nitric acid for several minutes.

The following specific examples are provided for illustration of the preferred embodiments of the present invention and should not be considered limiting on the scope of the invention

SPECIFIC EXAMPLE 1

Argon gas was flowed at the rate of 100 ml/min during the increase of temperature and switched to flowing hydrogen gas when the temperature was about 1000° C. After reaching the preset reaction temperature of 1100° C., the mixture solution was introduced into the reaction chamber so as to begin the reaction. The solution was the mixture solution of n-hexane, ferrocene (0.01 g/ml) and thiophene (0.6 wt. %). The flow rate of the solution was about 0.5 ml/min, while the flow rate of hydrogen gas was about 200 ml/min. The reaction was conducted for 60 minutes and then terminated the reaction by flowing argon gas at 100 ml/min instead of flowing hydrogen and collecting the nanotube products after cooling the reaction chamber to room temperature.

The morphology and microstructures of the products were examined using SEM and TEM. The products are up to 20 cm in length and consist of single walled carbon nanotubes and carbon nanotube fibers or strands. The purity of single walled carbon nanotubes is about 60%.

The diameter distribution and the degree of crystallization of produced nanotubes were examined using micro Raman. The single walled nanotube strand products consist of a large amount of densely packed aligned single walled carbon nanotube bundles having a diameter of about 20 nm to about 60 nm, in which the diameter of nanotubes is in the range of 1-2 nm.

SPECIFIC EXAMPLE 2

The experiment of example 1 was repeated, except for the following differences. The reaction temperature was 1150° C., ferrocene concentration was 0.02 g/ml, thiophene concentration was 0.4 wt. % and the flow rate of hydrogen gas was about 250 ml/min.

The morphology and microstructures of the carbon nanotube strand products were examined using SEM and TEM. The products were up to 20 cm in length and consisted of single walled carbon nanotubes and small amount of multi-walled carbon nanotubes. The purity of single walled carbon nanotubes was about 85%. The diameter distribution and the degree of crystallization of produced nanotubes were examined using micro Raman. The single walled nanotube products consisted of a large amount of densely packed aligned single walled carbon nanotube bundles having a diameter of about 10 to about 50 nm, in which the diameter of nanotubes is in the range of 1-2 nm.

SPECIFIC EXAMPLE 3

The experiment of example 1 was repeated, except for the following differences. The reaction temperature was 1200° C., ferrocene concentration was 0.018 g/ml, thiophene concentration was 0.4 wt. %, the solution flow rate was about 0.2 ml/min and the flow rate of hydrogen gas was about 250 ml/min.

The morphology and microstructures of the carbon nanotube strand products were examined using SEM and TEM. The products were up to 20 cm in length and consisted of single walled carbon nanotubes, small amount of multiwalled carbon nanotubes and carbon nanofibers. The purity of single walled carbon nanotubes was about 80%. The diameter distribution and the degree of crystallization of produced nanotubes were examined using micro Raman. The single walled nanotube products consist of a large amount of densely packed aligned single walled carbon nanotube bundles having a diameter of about 10 to about 60 nm, in which the diameter of nanotubes is in the range of 1-2 nm.

SPECIFIC EXAMPLE 4

The experiment of example 1 was repeated, except for the following differences. The reaction temperature was 1200° C., ferrocene concentration was 0.018 g/ml, thiophene concentration was 0.2 wt. %, the solution flow rate was about 0.8 ml/min and the flow rate of hydrogen gas was about 250 ml/min.

The morphology and microstructures of the carbon nanotube strand products were examined using SEM and TEM. The products were up to 20 cm in length and consisted of single walled carbon nanotubes and carbon nanofibers. The purity of single walled carbon nanotubes was about 70%. The diameter distribution and the degree of crystallization of produced nanotubes were examined using micro Raman. The single walled nanotube products consist of a large amount of densely packed aligned single walled carbon nanotube bundles having a diameter of about 20 nm to about 60 nm, in which the diameter of nanotubes was in the range of 1-2 nm.

SPECIFIC EXAMPLE 5

The experiment of example 1 was repeated, except for the following differences. The reaction temperature was 1200° C., ferrocene concentration was 0.018 g/ml, thiophene concentration was 0.5 wt. %, and the flow rate of hydrogen gas was about 150 ml/min. The solution flow rate was about the same as that of the first specific example, 0.5 ml/min.

The morphology and microstructures of the carbon nanotube strand products were examined using SEM and TEM. The products were up to 20 cm in length and consisted of single walled carbon nanotubes, multiwalled carbon nanotubes and carbon nanofibers. The purity of single walled carbon nanotubes was about 70%. The diameter distribution and the degree of crystallization of produced nanotubes were examined using micro Raman. The single walled nanotube products consist of a large amount of densely packed aligned single walled carbon nanotube bundles having a diameter of about 20 to about 60 nm, in which the diameter of nanotubes was in the range of 1-2 nm.

SPECIFIC EXAMPLE 6

The experiment of example 1 was repeated, except for the following differences. The reaction temperature was 1200° C., ferrocene concentration was 0.018 g/ml, thiophene concentration was 0.5 wt. %, and the flow rate of hydrogen gas was about 300 ml/min. The solution flow rate was about the same as that of the first specific example, 0.5 ml/min.

The morphology and microstructures of the carbon nanotube strand products were examined using SEM and TEM. The products were up to 20 cm in length and consist of single walled carbon nanotubes and small amount of multiwalled carbon nanotubes. The purity of single walled carbon nanotubes was about 80%. The diameter distribution and the degree of crystallization of produced nanotubes were examined using micro Raman. The single walled nanotube products consist of a large amount of densely packed aligned single walled carbon nanotube bundles having a diameter of about 10 to about 50 nm, in which the diameter of nanotubes was in the range of 1-2 nm.

SPECIFIC EXAMPLE 7

The experiment of example 1 was repeated, except for the following differences. The reaction temperature was 1150° C., ferrocene concentration was 0.018 g/ml, thiophene concentration was 0.4 wt. %, and the flow rate of hydrogen gas was about 150 ml/min. The solution flow rate was about the same as that of the first specific example, 0.5 ml/min. Single-walled nanotubes were formed in abundance during this continuous process. Yields of about 0.5 g/hour were obtained, which rivals current production techniques.

FIG. 4 is an optical image showing two samples of as-grown SWNT strands with lengths of 20 cm and 10 cm, respectively, by the method of specific example 7. These strands generally have diameter of about 0.3 mm, which is larger than a human hair. The strands generally consist of a plurality of thinner SWNT ropes, as indicated by the white arrows in FIG. 4. The strands generally have a diameter of about 0.3 to about 0.5 mm. The inset in FIG. 4 shows that one strand is tied in a knot, demonstrating the high flexibility of the strand.

The edges of the SWNT strands are smooth and continuous, with a few individual nanotube bundles protruding out of the edge, as shown in FIG. 2 and FIG. 5A, which are SEM images of the same SWNT strand. When the SWNT strand is carefully peeled along its length, a plurality of thinner SWNT ropes are obtained. FIG. 5B is a high-resolution SEM view along a single rope, which indicates that the rope consists of well-aligned bundles of SWNTs. FIG. 5C is a high-resolution transmission electron microscope (HRTEM) image of a top view of the SWNT rope which shows that each bundle in a SWNT rope is composed of aligned SWNTs. The inset in FIG. 5C shows a cross sectional view of a polycrystalline SWNT bundle. For TEM observation, a SWNT rope was torn apart by tweezers and affixed on the TEM grid by wetting with a drop of ethanol or acetone.

Raman spectroscopy measurements conducted on the nanotube strands suggest that both metallic (characteristic Raman peaks around 197.4 cm$^{-1}$ and 215.6 cm$^{-1}$) and semi-conducting (Raman peaks around 146.6 cm$^{-1}$) SWNTs coexist with wide diameter distributions of nanotubes from 1.1 to 1.7 nm. However, a sharp Raman peak at 215.3 cm$^{-1}$ suggests that there is a dominant diameter of 1.1 nm for the nanotubes in the sample.

The present inventors also conducted X-ray diffraction studies on the strands, focusing on the low frequency regions. The present inventors obtained a well-defined peak at Q=0.51 Å$^{-1}$ corresponding to d (1,0) of the nanotube triangular lattice, where the scattering vector Q=4π sin θ/λ. The lattice parameter calculated from this peak position is 1.42 nm, which comes from a lattice assembled from 1.1 nm diameter nanotubes. This data fits very well with calculated results of lattice parameters of finite crystallites made from nanotubes of different diameters.

The macroscopic electrical resistivity of the SWNT strands was measured on some of the long strands of SWNTs (with diameters from 50 μm to 0.5 mm) from room temperature to 5 K by a four-probe method. The crossover temperature (from metallic to semiconducting) in the measured samples occurs at about 90 K. Metallic behavior was seen with resistivity of about 5 to 7×10$^{-6}$ Ω·m in the temperature range of 90 to 300 K. This resistivity is about 6 times larger than the value of single bundle reported previously in J. E. Fischer et al., *Phys. Rev. B* 55, R4921 (1997), but less than that of the as grown and pressed materials. The temperature (about 90 K) at which the electrical behavior of the strands shifts from metallic to semiconducting differs from the previously reported value of 35 K. This is presumably because the fraction of metallic to semiconducting nanotubes, as well as the diameter distribution, packing, etc. in the macroscopic nanotube strands is different compared to bulk nanotubes prepared by other techniques. The values of resistivity measured between probes are low enough to suggest that there are macroscopic lengths of continuous conducting paths (nanotubes) in the strands.

Since the nanotube strands are of macroscopic lengths and can be manipulated quite easily, direct tensile tests can be performed on individual strands. The stress in the strands will depend on the actual cross-section supporting the load, which is difficult to determine at any instant. An additional challenge in interpreting the test results is that a significant contribution to strain could result from the slippage between parallel ropes or individual nanotubes in the ropes, depending on how the sample is gripped and loaded. The present inventors have recorded direct tensile test measurements on individual strands of SWNT of centimeter lengths and these provide lower bound estimates for the mechanical properties (e.g. modulus) of the strands and suggest the robustness of these macroscopically long nanotube assemblies.

All the samples used in tensile tests were as-grown strands of nanotubes, several centimeters long. The strands were first separated with tweezers into several smaller strands having diameters from about 5 to 20 μm. The starting diameter of the nanotube strand is easily measured using SEM, as shown in FIG. 6A. For example, the diameter, $D_0$, of the strand shown in FIG. 6A was determined to be 10 microns. These strands were then glued with silver paste onto two pieces of hard paper, which was then mounted in a tensile test machine (United SSTM-1-PC) where the loads could range from 0.001 N to 200 N. FIG. 6B illustrates an example of a broken SWNT strand after testing. The broken part shows local deformation (white arrow) but not much pullout compared with other parts of the strand (black arrow).

Figure 7:
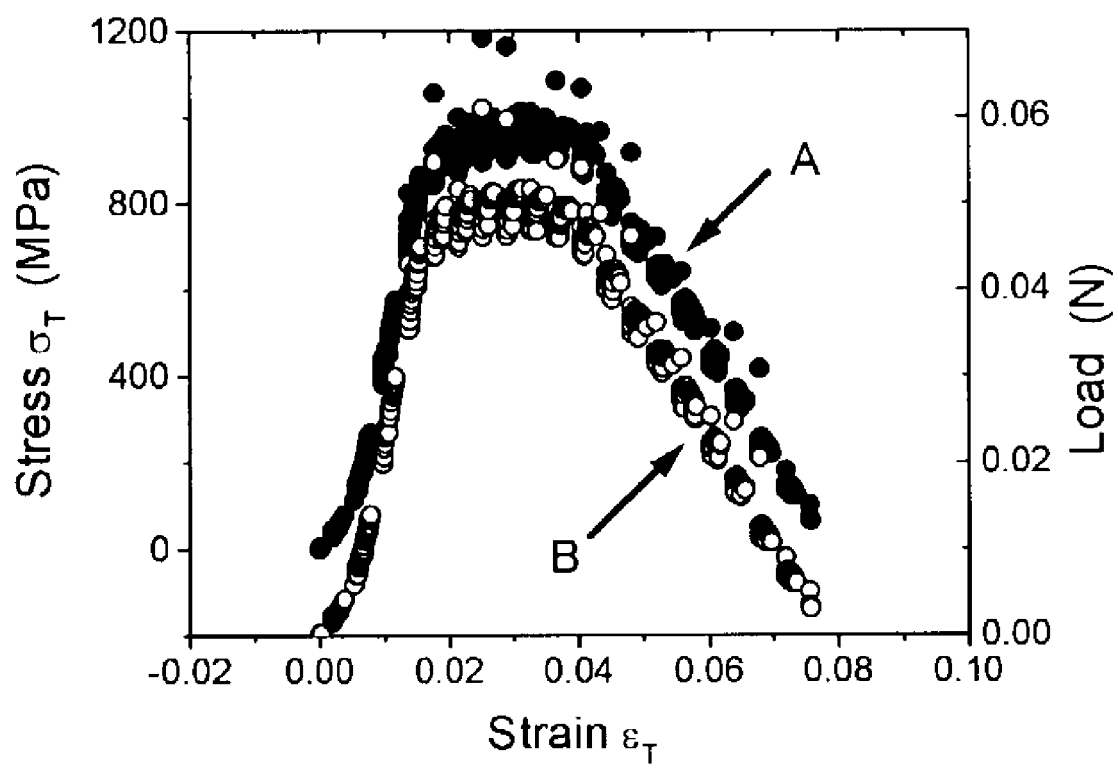
FIG. 7 is a plot of stress-strain curves of a nanotube strand subjected to tensile testing according to a preferred embodiment of the present invention.

During loading to failure, the nanotube strands and hence individual nanotubes experience two different strains, elastic strain and plastic strain (due to slippage between aligned nanotubes and real plastic deformation of individual nanotubes), consistent with the stress-strain curves observed in FIG. 7, indicating slippage and plastic deformation before failure. Considering the possible variation in the strand diameter during the deformation process, and the difficulty in determining the changes in diameter of the strands as deformation occurs, FIG. 7 illustrates a plot of the true stress ($\sigma_T$) vs. true strain ($\epsilon_T$) curves, rather than the usual engineering stress and strain. The true stress can be evaluated by knowing the strain at each point of loading.

The true strain $\epsilon_T$ is defined as $\epsilon_T=\ln(L_f/L_0)$, where $L_f$ is the real length of the sample and $L_0$ is the original length of the sample. The true strain could also be described as $\epsilon_T=2\ln(D_0/$ $D_f$) assuming the sample volume is constant, where, $D_0$ and $D_f$ are the original diameter and the real diameter of the sample during the measurement, respectively. Therefore, the true stress can be described as $\sigma_T = P/A = 4P\exp(\epsilon_T)\pi D_0^2$, where P is the load and A is the real surface area standing the load. Due to $\ln(1+\epsilon) \approx \epsilon$ when $\epsilon < 0.1$, the true stress-true strain curve has almost the same slope as that of the load-engineering strain curve in the elastic strain regime.

Thus, the true stress-true strain and the load-engineering strain curves shown in FIG. 7 have almost the same slopes in the elastic region of the curves (low strains). The Young's modulus can be estimated from the linear part of the stress-strain curve at the low strain regime (<2% in the figure) with observed values ranging from 49 GPa to 77 GPa. This is about 5 times the modulus reported for oriented SWNT fibers/ribbons by Vigolo et al., Science 290, 1331 (2000) and 50 times that of high-quality bucky paper reported by R. H. Baughman et al., *Science* 284, 1340 (1999).

These very long nanotube strands are handled and manipulated easily (see inset of FIG. 4, where the strand is tied into a knot) suggesting that these are not as brittle as nanotube aggregates prepared by other techniques. The Young's modulus estimates for these structures from the direct tensile tests are not as high as values expected for individual nanotubes (see M. M. J. Treacy, et al., *Nature* 381, 678 (1996) and E. W. Wong, et al. *Science* 277, 1971 (1997)) or small nanotube bundles (See M. F. Yu, et al., Phys. Rev. Lett., 84, 5552 (2000) and J. P. Lu, et al., Phys. Rev. Lett., 79, 1297 (1997)). But the numbers obtained for the modulus are lower bound estimates due to the uncertainty in knowing the exact cross-sectional area of the strands, supporting load. The nanotube strands are not monolithic structures and consist of parallel nanotube ropes separated by interstitial space. From the SEM measurements, the present inventors estimate that the approximate volume fraction of nanotubes in the strands is less than 48 percent by analyzing the spacing between the nanotube ropes in the strands (see F. Li, et al., Appl. Phys. Lett. 77, 3161 (2000)). If one considers only this cross-sectional area supporting the load during the tensile test, the modulus values for the strands will jump to about 100 to about 150 GPa, consistent with published literature on the modulus of large SWNT bundles (see L. Forro, et al., in Carbon Nanotubes: Synthesis, Structure, Properties and Applications, M. S. Dresselhaus, et al. Eds., Springer N.Y., 2001, pp. 329-390). Although individual SWNT has elastic modulus of about 1 TPa, the value can fail to about 100 GPa for nanotube bundles, due to the inter-nanotube defects (for example, imperfect lattice of nanotube bundles due to different nanotube diameters) present along the bundles.

The long nanotube strands created by the direct synthesis technique of the preferred embodiments of the present invention is a good alternative to the fibers and filaments spun from nanotube slurries. The mechanical and electrical properties of these strands are indeed superior to the latter fibers. The strands can be produced in high yield and continuously. The thickness of the strands and their length may be further optimized, by tuning the processing conditions, to produce practically useful nanotube based devices, such as strong, highly conducting micro-cables or mechanically robust electrochemical micro-actuators.

The foregoing description of the invention has been presented for purposes of illustration and description. It is not intended to be exhaustive or to limit the invention to the precise form disclosed, and modifications and variations are possible in light of the above teachings or may be acquired from practice of the invention. The description was chosen in order to explain the principles of the invention and its practical application. It is intended that the scope of the invention be defined by the claims appended hereto, and their equivalents. All articles mentioned herein are incorporated by reference in their entirety.

What is claimed is:

1. A continuous carbon nanotube strand having a length of at least 10 cm when it is directly synthesized.

2. The strand of claim 1, wherein the strand length is 10 to 30 cm.

3. The strand of claim 2, wherein the strand length is 10 to 20 cm.

4. The strand of claim 1, wherein the strand diameter is 0.3 to 0.5 μm.

5. The strand of claim 1, wherein the strand comprises a plurality of nanotube ropes.

6. The strand of claim 5, wherein the plurality of nanotube ropes comprise bundles of aligned single wall nanotubes.

7. The strand of claim 6, wherein the strand resistivity is about $5 \times 10^{-6}$ to $7 \times 10^{-6}$ Ohm-meters.

8. The strand of claim 6, wherein an electrical behavior of the strand shifts from metallic to semiconducting at above 35K.

9. The strand of claim 6, wherein an electrical behavior of the strand shifts from metallic to semiconducting at about 90K.

10. The strand of claim 6, wherein the Young's modulus of the strand is at least 49 GPa.

11. The strand of claim 10, wherein the Young's modulus of the strand is 49 to 77 GPa.

12. The strand of claim 10, wherein the Young's modulus of the ropes in the strand is about 100 to 150 GPa.

13. The strand of claim 1, wherein the strand is synthesized by catalytic pyrolysis of n-hexane in combination with thiophene, ferrocene and hydrogen carrier gas.

14. The strand of claim 1, wherein:
the strand length is about 10 to about 20 cm;
the strand comprises a plurality of nanotube ropes; and
the plurality of nanotubes ropes comprise bundles of aligned single wall nanotubes.

15. The strand of claim 14, wherein:
the strand resistivity is about $5 \times 10^{-6}$ to $7 \times 10^{-6}$ Ohm-meters;
an electrical behavior of the strand shifts from metallic to semiconducting at above 35K;
the Young's modulus of the strand is 49 to 77 GPa; and
the Young's modulus of the ropes in the strand is about 100 to 150 GPa.

16. A device, comprising the strand of claim 1 incorporated into the device.

17. The strand of claim 1, wherein the strand is made by chemical vapor deposition.

18. The strand of claim 17, wherein the strand is located in a reaction chamber of a chemical vapor deposition apparatus.

19. The strand of claim 17, wherein the strand is made by a floating catalyst chemical vapor deposition method.

20. The strand of claim 17, wherein a majority of iron catalyst particles are removed from the strand.

21. The strand of claim 1, wherein the strand comprises single walled carbon nanotubes.

* * * * *

UNITED STATES PATENT AND TRADEMARK OFFICE
CERTIFICATE OF CORRECTION

| | | |
|---|---|---|
| PATENT NO. | : 7,615,204 B2 | Page 1 of 1 |
| APPLICATION NO. | : 10/370519 | |
| DATED | : November 10, 2009 | |
| INVENTOR(S) | : Ajayan et al. | |

It is certified that error appears in the above-identified patent and that said Letters Patent is hereby corrected as shown below:

On the cover page,

Item [*] Notice: Subject to any disclaimer, the term of this patent is extended or adjusted under 35 USC 154(b) by (1214) days Delete the phrase "by 1214 days" and insert -- by 1464 days --

Signed and Sealed this

Twenty-fourth Day of August, 2010

David J. Kappos
*Director of the United States Patent and Trademark Office*